(12) United States Patent
Romano et al.

(10) Patent No.: US 8,421,542 B2
(45) Date of Patent: Apr. 16, 2013

(54) METHOD AND APPARATUS FOR DRIFT COMPENSATION IN PLL

(75) Inventors: Luca Romano, Milan (IT); Randy Tsang, Foster City, CA (US)

(73) Assignee: Marvell World Trade Ltd., St. Michael (BB)

( * ) Notice: Subject to any disclaimer, the term of this patent is extended or adjusted under 35 U.S.C. 154(b) by 0 days.

(21) Appl. No.: 13/104,404

(22) Filed: May 10, 2011

(65) Prior Publication Data

US 2012/0019327 A1    Jan. 26, 2012

Related U.S. Application Data

(60) Provisional application No. 61/349,625, filed on May 28, 2010.

(51) Int. Cl.
*H03L 7/08* (2006.01)
(52) U.S. Cl.
USPC ............. 331/17; 331/34; 331/179; 327/156; 375/376
(58) Field of Classification Search ............ 331/1 A, 331/1 R, 16, 17, 34, 177 R, 179; 327/147, 327/156; 375/373, 376
See application file for complete search history.

(56) References Cited

U.S. PATENT DOCUMENTS

| | | | | |
|---|---|---|---|---|
| 5,949,281 | A * | 9/1999 | Sharpe | 329/325 |
| 6,642,799 | B2 * | 11/2003 | Tang | 331/16 |
| 6,993,107 | B2 * | 1/2006 | Cranford et al. | 375/376 |
| 7,049,866 | B2 * | 5/2006 | Wilson | 327/157 |
| 7,133,485 | B1 * | 11/2006 | Baird et al. | 375/376 |
| 7,262,725 | B2 | 8/2007 | Huang et al. | |
| 7,940,129 | B1 | 5/2011 | Tsang | |
| 2003/0001679 | A1 | 1/2003 | Lever | |
| 2003/0222722 | A1 | 12/2003 | Kwon | |
| 2006/0226916 | A1 * | 10/2006 | Florescu et al. | 331/16 |

OTHER PUBLICATIONS

T. Tanzawa et al., "A Temperature-Compensated CMOS LC-VCO Enabling the Direct Modulation Architecture in 2.4GHz GFSK Transmitter," IEEE 2004 Custom Integrated Circuits Conference. (13-4-1 to 13-4-4).
J. Oehm et al., "Linear Controlled Temperature Independent Varactor Circuitry," ESSCIRC 2002. (p. 143 to 146).
H. Chang et al., "A 320fs-RMS-Jitter and 300kHz-BW All-Digital Fractional-N PLL with Self-Corrected TDC and Fast Temperature Tacking Loop for WiMax/WLAN 11n," 2009 Symposium on VLSI Circuits Digest of Technical Papers. (p. 188 to 189).
S. Bruss et al., "A 5GHz CMOS PLL with Low KVCO and Extended Fine-Tuning Range," 2008 IEEE Radio Frequency Integrated Circuits Symposium. (p. 669 to 672).

(Continued)

*Primary Examiner* — Levi Gannon

(57) ABSTRACT

Aspects of the disclosure provide a phase-locked loop (PLL). The PLL includes a voltage-controlled oscillator (VCO), a detector module, and a ramp module. The VCO has a first capacitor unit and a second capacitor unit. The VCO is configured to generate an oscillating signal having a frequency based on a first capacitance of the first capacitor unit and a second capacitance of the second capacitor unit. The detector module is configured to generate a voltage signal as a function of the oscillating signal and a reference signal. The voltage signal is used to control the first capacitor unit to stabilize the frequency of the oscillating signal. The ramp module is configured to generate a ramp signal based on the voltage signal. The ramp signal is used to control the second capacitor unit to ramp the second capacitance from a first value to a second value.

20 Claims, 6 Drawing Sheets

OTHER PUBLICATIONS

USPTO U.S. Appl. No. 13/088,645. Randy Tsang et al., "Low KVCO Phase-Locked Loop With Large Frequency Drift Handling Capability" Filed Apr. 18, 2011.

International Search Report and Written Opinion mailed Jul. 12, 2011 in counterpart international Application No. PCTTUS2011/035906.

* cited by examiner

METHOD AND APPARATUS FOR DRIFT COMPENSATION IN PLL

INCORPORATION BY REFERENCE

This application claims the benefit of U.S. Provisional Application No. 61/349,625, "PLL Ramp-Based Temperature Drift Compensation" filed on May 28, 2010, which is incorporated herein by reference in its entirety.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Generally, a phase-locked loop (PLL) includes a voltage-controlled oscillator (VCO) to generate an oscillating signal based on a voltage signal. The PLL is suitably configured to adjust the voltage signal to achieve a desired oscillating frequency. In a low noise application, the VCO is configured to have a relatively small gain (Kvco), which is a ratio of a frequency change over a voltage change, to reduce sensitivity to noise. During operation, environmental changes, such as a temperature drift, and the like, affect the oscillating frequency of the oscillating signal. To maintain the desired oscillating frequency, the PLL adjusts the voltage signal to compensate for the effects of the environmental changes. However, due to the relatively small gain, the voltage signal may exceed a voltage limit when the temperature drift is too large, for example, and the PLL may fail to keep the desired frequency.

SUMMARY

Aspects of the disclosure provide a phase-locked loop (PLL). The PLL includes a voltage-controlled oscillator (VCO), a detector module, and a ramp module. The VCO has a first capacitor unit and a second capacitor unit. The VCO is configured to generate an oscillating signal having a frequency based on a first capacitance of the first capacitor unit and a second capacitance of the second capacitor unit. The detector module is configured to generate a voltage signal as a function of the oscillating signal and a reference signal. The voltage signal is used to control the first capacitor unit to stabilize the frequency of the oscillating signal. The ramp module is configured to generate a ramp signal based on the voltage signal. The ramp signal is used to control the second capacitor unit to ramp the second capacitance from a first value to a second value to keep the voltage signal in a predetermined range.

In an embodiment, the ramp module is configured to generate the ramp signal when the voltage signal is out of the predetermined range. In an example, the ramp module is configured to generate the ramp signal to ramp down the second capacitance when the voltage signal is larger than an upper limit of the predetermined range, and to ramp up the second capacitance when the voltage signal is smaller than the lower limit of the predetermined range.

Further, the ramp module includes a monitor configured to monitor the voltage signal, and generate a trigger signal when the voltage signal is out of the predetermined range. In addition, the ramp module includes a ramp controller configured to generate the ramp signal in response to the trigger signal.

In an embodiment, the ramp controller includes a counter configured to generate a digital ramp signal by starting counting in response to the trigger signal, and a digital to analog converter (DAC) configured to convert the digital ramp signal to the ramp signal.

In another embodiment, the ramp controller includes a counter configured to generate a digital ramp signal by starting counting in response to the trigger signal, and a sigma-delta modulator configured to generate a pulse stream that is modulated based on the digital ramp signal.

According to an aspect of the disclosure, the second capacitor unit includes at least a capacitor, and the ramp signal is used to ramp a control voltage of the capacitor from a first voltage to a second voltage. In an example, a switch switches the control voltage between a stable state and a ramp state. The capacitor is at least one of a junction-diode capacitor, and a metal-oxide-semiconductor (MOS) capacitor.

In an embodiment, the detector module includes a frequency divider configured to frequency divide the oscillating signal, a phase detector to detect phase errors between the frequency-divided oscillating signal and the reference signal, and a loop filter configured to generate the voltage signal based on the phase errors.

It is noted that the PLL can be used in an electronic system. The electronic system includes other components that use the generated oscillating signal. In an example, the electronic system includes a transceiver that uses the oscillating signal for transmitting or receiving signals.

Aspects of the disclosure provide a method for drift compensation. The method includes generating an oscillating signal based on a first capacitance of a first capacitor unit and a second capacitance of a second capacitor unit, generating a voltage signal as a function of the oscillating signal and a reference signal, adjusting the first capacitance of the first capacitor unit based on the voltage signal to stabilize the frequency of the oscillating signal, and ramping the second capacitance of the second capacitor unit from a first value to a second value when the voltage signal is out of a predetermined range.

To ramp the second capacitance of the second capacitor unit, the method includes ramping down the second capacitance when the voltage signal is larger than an upper limit of the predetermined range, and ramping up the second capacitance when the voltage signal is smaller than a lower limit of the predetermined range.

In an embodiment, the second capacitor unit includes at least a capacitor, such as a junction-diode capacitor, a metal-oxide-semiconductor (MOS) capacitor, and the like. The method includes ramping a control voltage of the capacitor from a first voltage to a second voltage, or from the second voltage to the first voltage. In an example, the method includes switching the control voltage of the capacitor from a stable state to a ramp state that ramps from the first voltage to the second voltage or from the second voltage to the first voltage.

According to an aspect of the disclosure, the method includes monitoring the voltage signal, generating a trigger signal when the voltage signal is out of the predetermined range, and generating the ramp signal in response to the trigger signal.

To generate the ramp signal in response to the trigger signal, in an embodiment, the method further includes generating a digital ramp signal by starting counting in response to the trigger signal, and digital to analog converting the digital ramp signal into the ramp signal. In another embodiment, the method includes generating a digital ramp signal by starting counting in response to the trigger signal, and generating a pulse stream that is modulated based on the digital ramp signal.

To generate the voltage signal as a function of the oscillating signal and the reference signal, in an example, the method includes frequency-dividing the oscillating signal, detecting phase errors between the frequency-divided oscillating signal and the reference signal, and generating the voltage signal based on the phase errors.

BRIEF DESCRIPTION OF THE DRAWINGS

Various embodiments of this disclosure that are proposed as examples will be described in detail with reference to the following figures, wherein like numerals reference like elements, and wherein.

DETAILED DESCRIPTION OF EMBODIMENTS

Figure 1:
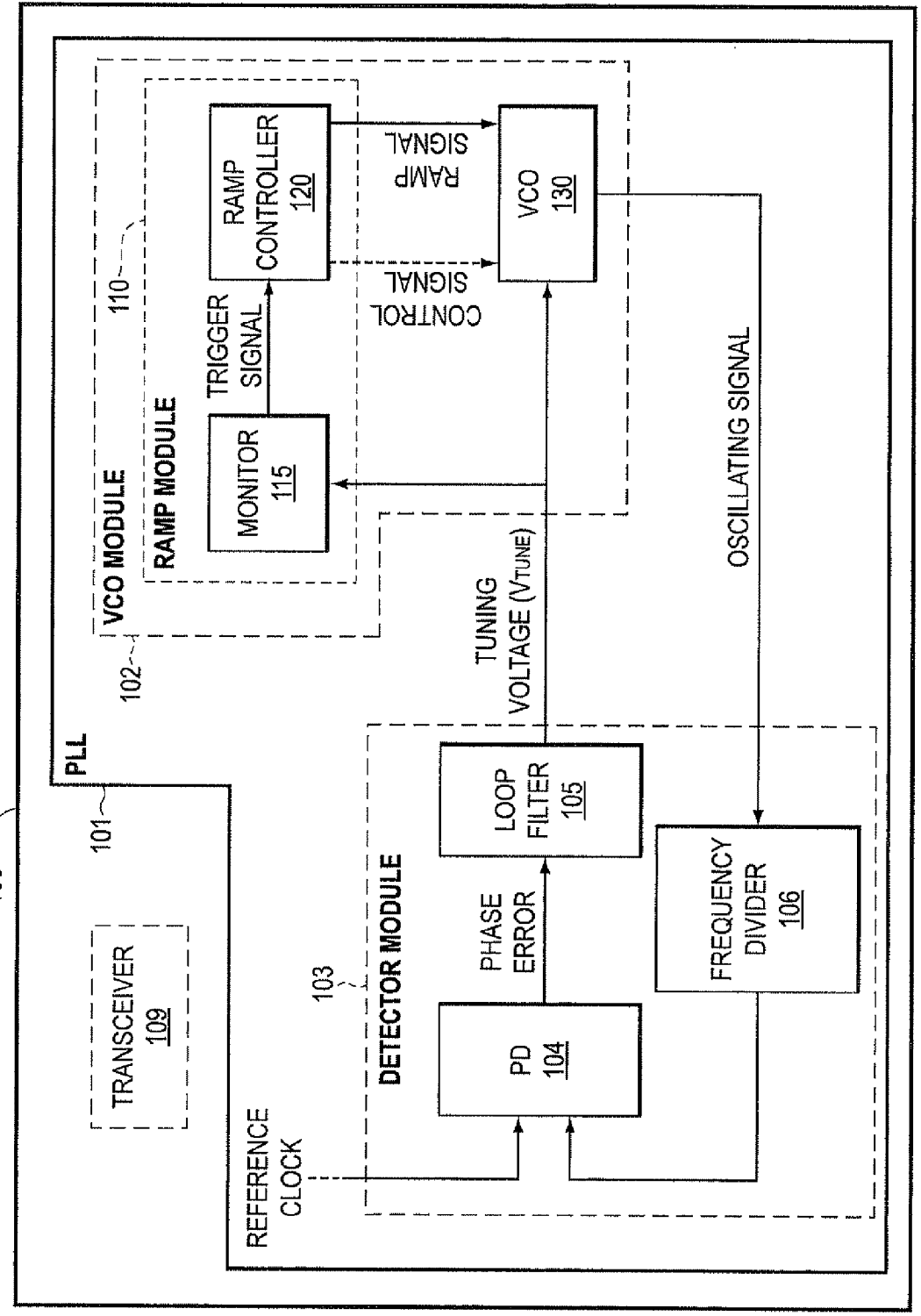
FIG. 1 shows a block diagram of an electronic system example 100 according to an embodiment of the disclosure.

FIG. 1 shows a block diagram of an electronic system example 100 according to an embodiment of the disclosure. The electronic system 100 includes a phase-locked loop (PLL) 101 to generate an oscillating signal. The oscillating signal is used by other components of the electronic system 100, such as a transceiver 109, and the like. The PLL 101 includes a voltage-controlled oscillator (VCO) module 102 with ramp-based drift compensation. Further, the PLL 101 includes a detector module 103 that is coupled with the VCO module 102 as shown in FIG. 1.

The VCO module 102 receives a tuning voltage $V_{TUNE}$ from the detector module 103 and generates an oscillating signal with a frequency being adjusted based on the tuning voltage $V_{TUNE}$. The detector module 103 compares the oscillating signal with a reference clock signal, detects errors, such as frequency errors, phase errors, and the like, of the oscillating signal with comparison to the reference clock signal, and generates the tuning voltage $V_{TUNE}$ based on the detected errors.

In an embodiment, the detector module 103 includes a phase detector (PD) 104, a loop filter 105 and a frequency divider 106. These elements are coupled together as shown in FIG. 1. In an example, the reference clock signal is generated based on a crystal oscillator, and has a relatively stable reference clock frequency. The oscillating signal is required to have a much larger frequency, such as M times (M is a positive integer number) of the reference clock frequency. The frequency divider 106 frequency-divides the oscillating signal by M, and provides the frequency-divided oscillating signal to the phase detector 104. The phase detector 104 compares the frequency-divided oscillating signal with the reference clock signal, and generates information about the instantaneous phase error of the frequency-divided oscillating signal with comparison to the reference clock signal. The loop filter 105 is configured as a low pass filter that passes a low frequency component, such as an average phase error information, and generates the tuning voltage $V_{TUNE}$ as a function of the average.

The VCO module 102 includes a ramp module 110 to generate a ramp signal, such as a ramp voltage signal, and the like, and a VCO 130 with a ramp-controlled attribute. In an example, the ramp module 110 includes a monitor 115 and a ramp controller 120. The monitor 115 monitors the tuning voltage $V_{TUNE}$. When the tuning voltage $V_{TUNE}$ is outside a predetermined range, the monitor 115 generates a trigger signal. For example, when the tuning voltage $V_{TUNE}$, is larger than an upper limit of the predetermined range, the trigger signal is a ramp-up trigger signal; and when the tuning voltage $V_{TUNE}$ is smaller than a lower limit of the predetermined range, the trigger signal is a ramp-down trigger signal.

The ramp controller 120 generates the ramp signal in response to the trigger signal. The ramp signal has a ramp attribute, such as ramp voltage, ramp current, ramp frequency and the like. In an example, when the trigger signal is a ramp-up trigger signal, the ramp controller 120 generates a voltage signal that ramps from a first voltage having a relatively lower value to a second voltage having a relatively higher value; and when the trigger signal is a ramp-down trigger signal, the ramp controller 120 generates the voltage signal that ramps from the second voltage having the relatively higher value to the first voltage having the relatively lower value.

The VCO 130 has an attribute, such as a capacitance, an inductance, a resistance, and the like that is controlled by the ramp signal. In an example, the VCO 130 includes a first capacitor unit (not shown), and a second capacitor unit (not shown). The first capacitor unit has a first capacitance controlled by the tuning voltage $V_{TUNE}$. The second capacitor unit has a second capacitance that is controlled by the ramp signal, thus the second capacitance ramps in response to the ramp signal. The VCO 130 generates the oscillating signal having an oscillating frequency. The oscillating frequency is a function of a combination of the first capacitance and the second capacitance. It is noted that the oscillating frequency may also depend on other attribute of the VCO 130, such as an inductance, a resistance, and the like.

During operation, in an embodiment, the tuning voltage $V_{TUNE}$ is preferred to stay in the pre-determined range. When the tuning voltage $V_{TUNE}$ is larger than the upper limit, the ramp-up signal is generated, and the ramp-up signal is used to ramp up a control voltage that controls the second capacitor unit to ramp down the second capacitance from a relatively higher value to a relatively lower value. In an example, the ramp signal has a relatively slow ramp rate, such that the PLL 101 is able to adjust the tuning voltage $V_{TUNE}$ in response to the ramp-down of the second capacitance, and the tuning voltage $V_{TUNE}$ is pulled down in the predetermined range. The ramp rate can be suitably determined, such that while the tuning voltage $V_{TUNE}$ is pulled down in the pre-determined range, the oscillating frequency of the oscillating signal keeps substantially stable. Then, the oscillating signal is suitable for use in the transceiver 109 during active operations, such as during transmitting, or during receiving.

When the tuning voltage $V_{TUNE}$ is smaller than the lower limit, the ramp-down signal is generated and the ramp-down signal is used to ramp down a control voltage that controls the second capacitor unit to ramp up the second capacitance from a relatively lower value to a relatively higher value. In an example, the ramp signal has a relatively slow ramp rate, such that the PLL 101 is able to adjust the tuning voltage $V_{TUNE}$ in response to the ramp-up of the second capacitance, and the tuning voltage $V_{TUNE}$ is pulled up in the predetermined range. The ramp rate can be suitably determined, such that while the tuning voltage $V_{TUNE}$ is pulled up in the pre-determined range, the oscillating frequency of the oscillating signal keeps substantially stable. Then, the oscillating signal is suitable for use in the transceiver 109 during active operations, such as during transmitting, or during receiving.

In a comparison electronic system (not shown), when a tuning voltage for a VCO is outside a predetermined range, a capacitance of the VCO is switch-controlled to change from a first value to a second value in a relatively short time. Thus, an oscillating signal of the VCO has a disturbed oscillating frequency due to the fast-changing capacitance. While, eventually, the oscillating frequency will be stable, however, the disturbed oscillating signal is not suitable for use for the transceiver 109 during its transmitting or receiving operation, for example.

Figure 2:
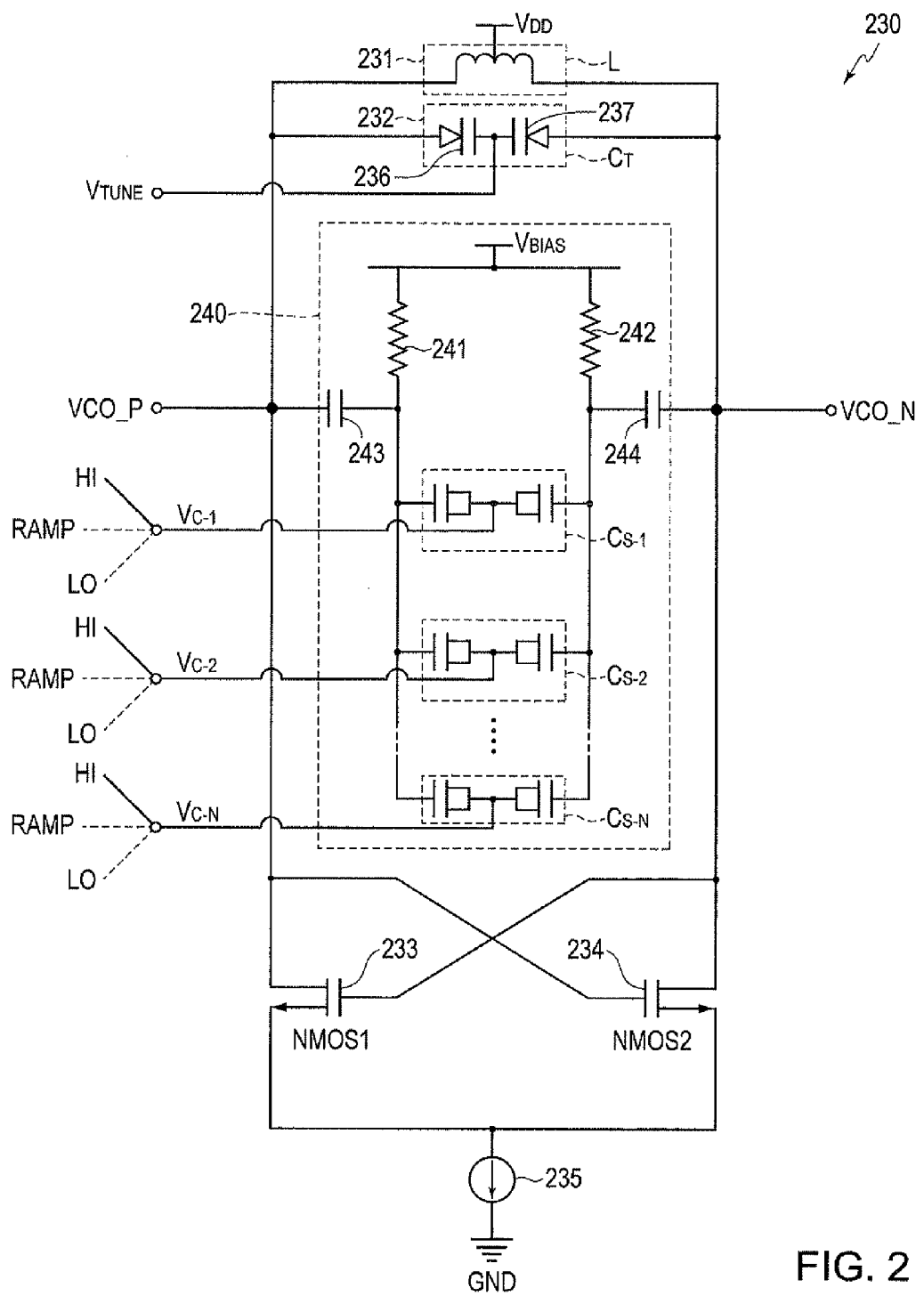
FIG. 2 shows a block diagram of a voltage-controlled oscillator example 230 according to an embodiment of the disclosure.

FIG. 2 shows a block diagram of a voltage-controlled oscillator (VCO) example 230 according to an embodiment of the disclosure. The VCO 230 can be used in the electronic system 100. The VCO 230 is an inductor-capacitor type (LC) oscillator. The VCO 230 includes an inductor unit 231, a first capacitor unit 232, a second capacitor unit 240, two transistors 233 and 234, and a current source 235. The first capacitor unit 232 is controlled by the tuning voltage signal $V_{TUNE}$, and the second capacitor unit 240 is controlled by signals that may ramp from a first value to a second value over a time duration. These elements are coupled together as shown in FIG. 2.

In the embodiment, the VCO 230 is configured in a differential form having a positive output node VCO_P, and a negative output node VCO_N. Specifically, the transistors 233 and 234 are cross-coupled and share the current source 235 at sources of the transistors 233 and 234. The drains of the transistors 233 and 234 respectively drive the positive output node VCO_P and the negative output node VCO_N. The inductor unit 231 is symmetrically coupled to the positive output node VCO_P and the negative output node VCO_N to provide an inductance to both the positive output node VCO_P and the negative output node VCO_N. The first capacitor unit 232 and the second capacitor unit 240 are also symmetrically coupled to the positive output node VCO_P and the negative output node VCO_N to provide a combined capacitance to the positive output node VCO_P and the negative output node VCO_N. The VCO 230 generates a positive oscillating signal at the positive output node VCO_P, and a negative oscillating signal at the negative output node VCO_N. The positive oscillating signal and the negative oscillating signal have a same oscillating frequency that is a function of the inductance and the combined capacitance.

The first capacitor unit 232 provides a first capacitance to the positive output node VCO_P and the negative output node VCO_N. The first capacitance is controlled by the tuning voltage signal $V_{TUNE}$. In an embodiment, the first capacitor unit 232 includes a pair of matching varactors 236 and 237 that have a voltage-controlled capacitance. The anodes of the pair of matching varactors 236 and 237 are respectively coupled to the positive output node VCO_P and negative output node VCO_N as shown in FIG. 2. The cathodes of the pair of matching varactors 236 and 237 are controlled by the tuning voltage signal $V_{TUNE}$, thus the capacitances of the varactors 236 and 237 vary with the tuning voltage signal $V_{TUNE}$. It is noted that the varactors 236 and 237 can be implemented by any suitable devices, such as junction-diode capacitors, metal-oxide-semiconductor (MOS) capacitors, and the like. In an embodiment, when the tuning voltage signal $V_{TUNE}$ increases, the first capacitance decreases, and when the tuning voltages $V_{TUNE}$ decreases, the first capacitance increases.

The second capacitor unit 240 provides a second capacitance to the positive output node VCO_P and the negative output node VCO_N. The second capacitance can ramp from a first value to a second value over a time duration. In an embodiment, the second capacitor unit 240 includes a capacitor bank having a plurality of capacitor units $C_{S-1}$ to $C_{S-N}$ that are respectively controlled by a plurality of voltage control signals $V_{C-1}$ to $V_{C-N}$. Each of the capacitor units $C_{S-1}$ to $C_{S-N}$ includes a pair of matching varactors. The anodes of the pair of matching varactors are respectively coupled to the positive output node VCO_P and the negative output node VCO_N. The cathodes of the pair of matching varactors are controlled by one of the plurality of voltage control signals $V_{C-1}$ to $V_{C-N}$. It is noted that the varactors can be implemented by any suitable devices, such as junction-diode capacitors, metal-oxide-semiconductor (MOS) capacitor, and the like. In an embodiment, when a voltage control signal, such as $V_{C-1}$, is relatively low, the capacitor unit $C_{S-1}$ has relatively high capacitance, and when $V_{C-1}$ is relatively high, the capacitor unit $C_{S-1}$ has relatively low capacitance.

Each of the voltage control signals $V_{C-1}$ to $V_{C-N}$ has stable states and ramp states. When a voltage control signal is in a stable state, the pair of matching varactors controlled by the voltage control signal has relatively stable capacitances. When a voltage control signal is in a ramp state, the pair of matching varactors controlled by the voltage control signal has ramping capacitances.

In an example, the stable states include a relatively low voltage (LO) state and a relatively high voltage (HI) state, and the ramp states include a ramp-up state and a ramp-down state. In the LO state, the voltage control signal keeps at a relatively low voltage, and thus the pair of matching varactors controlled by the voltage control signal has a relatively high capacitance. In the HI state, the voltage control signal keeps at a relatively high voltage, and thus the pair of matching varactors controlled by the voltage control signal has a relatively low capacitance. In the ramp-up state, the voltage control signal increases, for example linearly, from the relatively low voltage to the relatively high voltage in a time duration. Then, the capacitances of the pair of matching varactors ramp down. In the ramp-down state, the voltage control signal decreases, for example linearly, from the relatively high voltage to the relatively low voltage in a time duration. Then, the capacitances of the pair of matching varactors ramp up.

During operation, when the tuning voltage signal $V_{TUNE}$ stays in a predetermined range, the voltage control signals $V_{C-1}$ to $V_{C-N}$ are in the stable states, either in the LO state or in the HI state. The second capacitance of the second capacitor unit 240 is stable. The oscillating frequency of the VCO 230 depends on the combination of the first capacitance and the second capacitance. The first capacitance is a function of the tuning voltage signal $V_{TUNE}$. The tuning voltage signal $V_{TUNE}$ is adjusted to keep the oscillating frequency stable.

When the tuning voltage $V_{TUNE}$ is larger than an upper limit of the predetermined range, one of the voltage control signals that was in the LO state, for example $V_{C-N}$, is switched to the ramp-up state. When $V_{C-N}$ ramps up, the capacitance of the capacitor unit $C_{S-N}$ ramps down. Thus, the second capacitance ramps down, which tends to increase the oscillating frequency. To keep the oscillating frequency stable, the tuning voltage $V_{TUNE}$ is lowered to increase the first capacitance. Thus, the tuning voltage $V_{TUNE}$ is pulled down into the predetermined range. When the VCO 230 is used in a PLL, such as the PLL 101, the ramp rate of the $V_{C-N}$ can be suitably determined to allow the PLL 101 to have enough time to response. Thus, in response to the ramp-up of $V_{C-N}$, the PLL 101 pulls down the tuning voltage $V_{TUNE}$ into the predetermined range, and keeps the oscillating frequency relatively stable.

When the tuning voltage $V_{TUNE}$ is smaller than a lower limit of the predetermined range, one of the voltage control signals that was in the HI state, for example $V_{C-1}$, is switched to the ramp-down state. When $V_{C-1}$ ramps down, the capacitance of the capacitor unit $C_{S-1}$ ramps up. Thus, the second capacitance ramps up, which tends to decrease the oscillating frequency. To keep the oscillating frequency stable, the tuning voltage $V_{TUNE}$ is raised to decrease the first capacitance. Thus, the tuning voltage $V_{TUNE}$ is pulled up into the predetermined range. When the VCO 230 is used in a PLL, such as the PLL 101, the ramp rate of the $V_{C-1}$ can be suitably determined to allow the PLL 101 to have enough time to response. Thus, in response to the ramp-down of $V_{C-1}$, the PLL 101 pulls up the tuning voltage $V_{TUNE}$ into the predetermined range, and keeps the oscillating frequency relatively stable.

Figure 3:
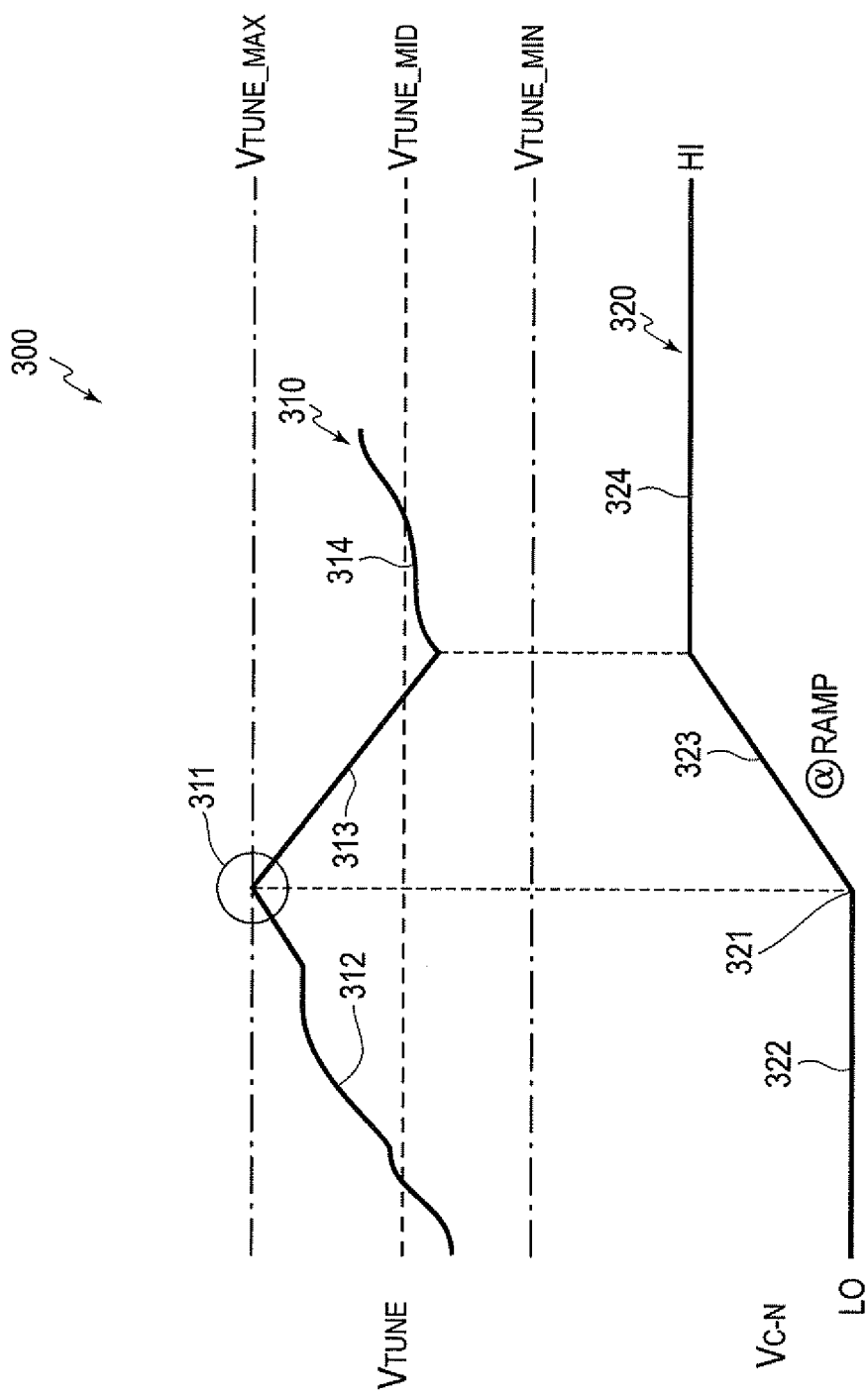
FIG. 3 shows a plot 300 of waveform examples for the voltage-controlled oscillator 230 according to an embodiment of the disclosure.

FIG. 3 shows a plot 300 of waveform examples for using VCO 230 in the PLL 101 according to an embodiment of the disclosure. The plot 300 includes a first waveform 310 for the tuning voltage signal $V_{TUNE}$, and a second waveform 320 for the voltage control signal $V_{C-N}$.

In an example, initially, the voltage control signal $V_{C-N}$ is at the LO state. When environmental conditions change, such as temperature drifts, and the like, the oscillating frequency of the VCO 230 tends to change. To keep the oscillating frequency stable, the tuning voltage signal $V_{TUNE}$ is adjusted to compensate for the environmental conditions changes. When the tuning voltage $V_{TUNE}$ stays in the predetermined range between the upper limit $V_{TUNE\_MAX}$ and the lower limit $V_{TUNE\_MIN}$, as shown by 312, the voltage control signal stays in the LO state, as shown by 322.

However, in an example, the VCO 230 is used in a low noise application. To reduce noise sensitivity, the gain of the VCO 230 is relatively small. Thus, when the environmental conditions changes are relatively large, the tuning voltage signal $V_{TUNE}$, is out of the predetermined range. For example, when a temperature raise is too high, the tuning voltage signal $V_{TUNE}$ becomes larger than the upper limit $V_{TUNE\_MAX}$, as shown by 311, which will trigger one of the voltage control signals, such as $V_{C-N}$, to switch to the ramp-up state as shown by 321. In the ramp-up state, the voltage control signal $V_{C-N}$ increases from the relatively low voltage to the relatively high voltage over a time duration, as shown by 323. The ramp-up of the voltage control signal $V_{C-N}$ results in a decrease of the second capacitance. The decrease of the second capacitance tends to increase the oscillating frequency of the VCO 230. To keep the oscillating frequency stable, the PLL 101 pulls down the tuning voltage $V_{TUNE}$, as shown by 313. In an example, the PLL 101 is suitably designed, such that when the voltage control signal $V_{C-N}$ reaches the relatively high voltage, the tuning voltage $V_{TUNE}$ is pulled to a position that is about the middle position, as shown by $V_{TUNE\_MID}$ in the FIG. 3, in the predetermined range.

When the voltage control signal $V_{C-N}$ reaches the relatively high voltage, the voltage control signal $V_{C-N}$ stays in the HI state. It is noted that when the temperature continues to rise, the tuning voltage signal $V_{TUNE}$ continues to rise, as shown by 314. The voltage control signal $V_{C-N}$ keeps at the HI state, as shown by 324. When the tuning voltage $V_{TUNE}$ rise higher than the upper limit $V_{TUNE\_MAX}$ again, another voltage control signal at the LO state, for example $V_{C-N-1}$, is switched to the ramp-up state.

Figure 4:
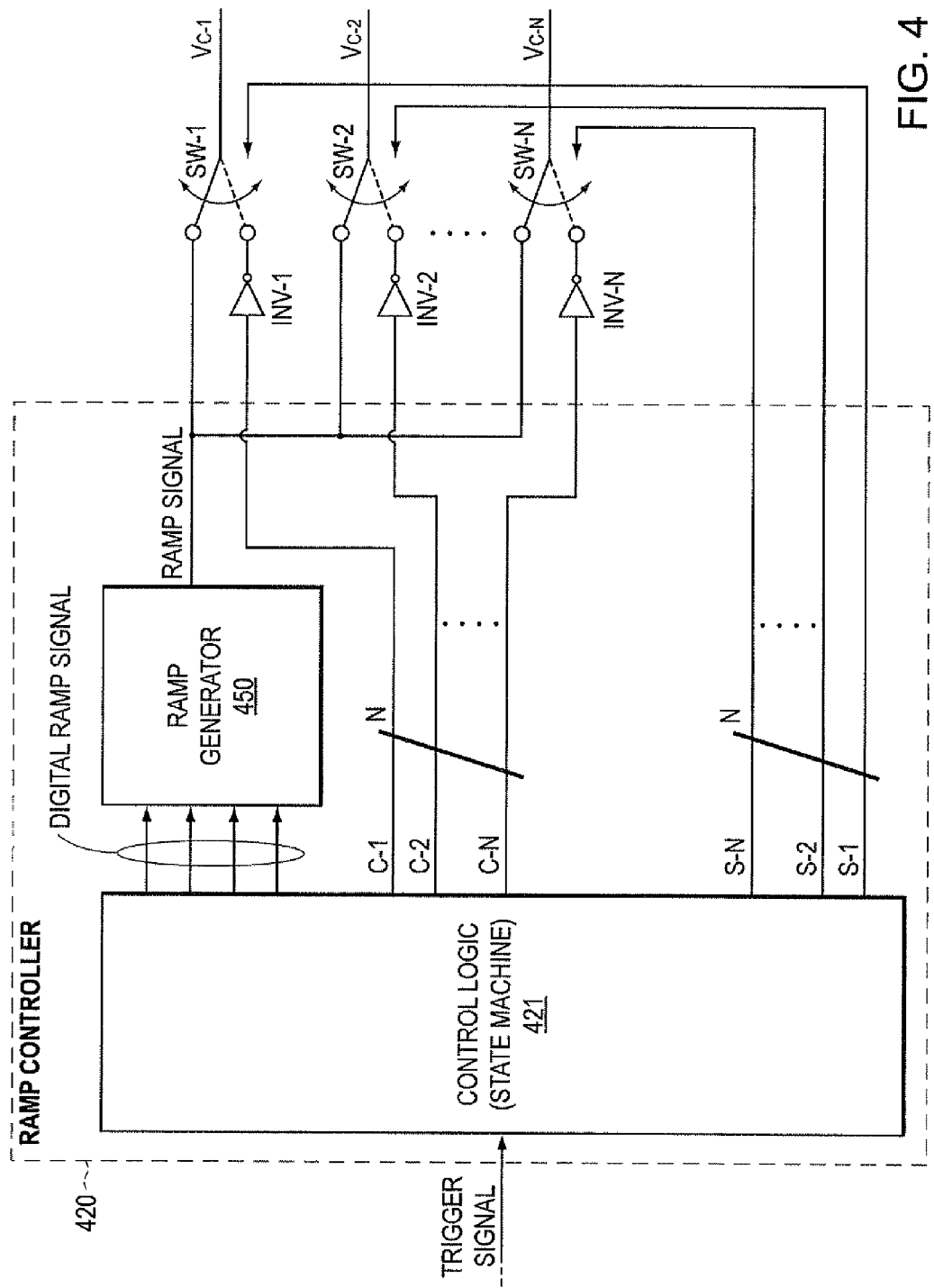
FIG. 4 shows a block diagram of a ramp controller example 420 according to an embodiment of the disclosure.

FIG. 4 shows a block diagram of a ramp controller example 420 according to an embodiment of the disclosure. The ramp controller 420 can be used to generate the voltage control signals $V_{C-1}$ to $V_{C-N}$ to control the VCO 230. The ramp controller 420 generates control signals C-1 to C-N, switch signals S-1 to S-N, and a ramp signal. The switch signals S-1 to S-N are respectively used to control switches SW-1 to SW-N. Each switch, such as SW-1, is controlled to either direct the ramp signal as the voltage control signal $V_{C-1}$ or direct the corresponding control signal C-1 as the voltage control signal $V_{C-1}$. The ramp controller 420 includes a control logic 421 and a ramp generator 450. These elements are coupled together as shown in FIG. 4.

The control logic 421 generates the control signals C-1 to C-N to control the stable states of the voltage control signals $V_{C-1}$ to $V_{C-N}$. In an example, the control signals C-1 to C-N are binary signals. The ramp controller 420 includes suitable driving circuits, such as inverters INV-1 to INV-N to drive the voltage control signals $V_{C-1}$ to $V_{C-N}$ to the LO state or the HI state based on the binary signals C-1 to C-N.

In addition, the control logic 421 generates a digital ramp signal in response to a received trigger signal, and provides the digital ramp signal to the ramp generator 450. In an embodiment, the control logic 421 includes a counter (not shown) that counts up from zero to a full-scale digital number in response to a ramp-up trigger signal and counts down from the full-scale digital number to zero in response to a ramp-down trigger signal.

The ramp generator 450 receives the digital ramp signal, and generates an analog ramp signal, and provides the analog ramp signal to the switches SW-1 to SW-N.

Further, the control logic 421 generates switch signals S-1 to S-N to respectively control the switches SW-1 to SW-N. Based on the switch signals S-1 to S-N, the switches SW-1 to SW-N respectively control the voltage control signals $V_{C-1}$ to $V_{C-N}$ to be the stable signals or the ramp signal.

In an example, when the tuning voltage $V_{TUNE}$ is in the predetermined range, the trigger signal is not generated. The control logic 421 generates the control signals C-1 to C-N. The control signals C-1 to C-N control the inverters INV-1 to INV-10 to generate stable states. Further, the control logic 421 outputs the switch signals S-1 to S-N to control the switches SW-1 to SW-N to direct the stable states to the voltage control signals $V_{C-1}$ to $V_{C-N}$.

When the trigger signal is a ramp-up trigger signal, for example, the control logic 421 generates a digital ramp-up signal, and provides the digital ramp-up signal to the ramp generator 450. The ramp generator 450 generates an analog ramp-up signal. In addition, the control logic 421 adjusts a switch signal, for example S-N, to switch the corresponding switch SW-N to direct the analog ramp-up signal to the corresponding voltage control signal that was in the LO state previously. It is noted that the control logic 421 may keep the rest of the switch signals, for example S-1 to S-N-1. In addition, in an example, the control logic 421 also updates the control signal, for example, C-N from 1 to 0, to the corresponding switch. When the output $V_{C-N}$ reaches the HI state, the control logic 421 then adjusts the switch signal S-N to switch back the corresponding switch SW-N to direct the stable control signal to the output.

The control logic 421 can be implemented by any suitable techniques. In an embodiment, the control logic 421 is implemented by a state machine.

Figure 5:
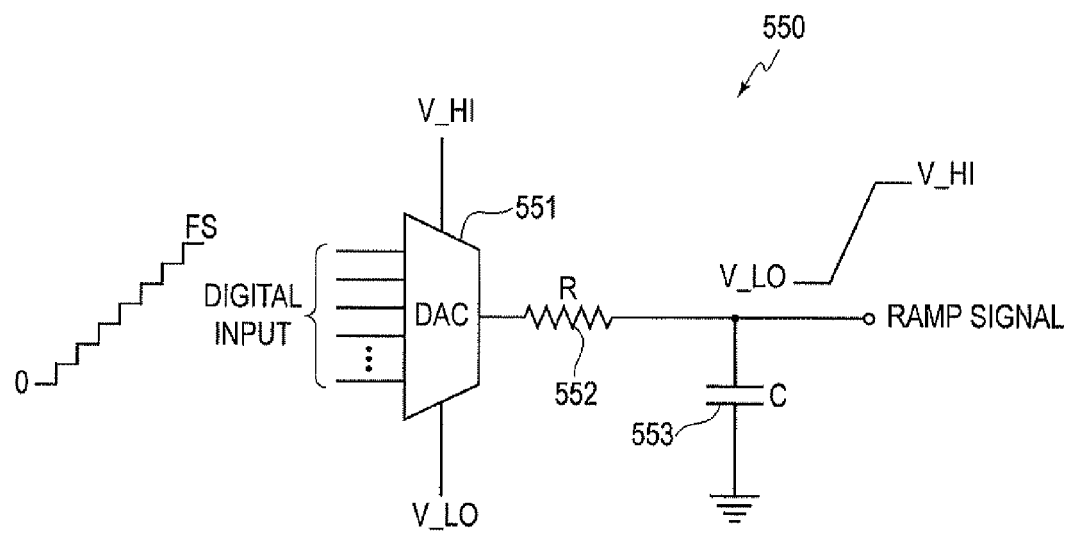
FIG. 5 shows a diagram of a ramp generator example 550 according to an embodiment of the disclosure.

FIG. 5 shows a diagram of a ramp generator example 550 according to an embodiment of the disclosure. The ramp generator 550 includes a digital to analog converter (DAC)

551, a resistor 552 and a capacitor 553. These elements are coupled together as shown in FIG. 5.

The DAC 551 receives the digital ramp signal, and converts the digital ramp signal to an analog signal. The resistor 552 and the capacitor 553 form a low pass filter to remove high frequency components, and to output the analog ramp signal.

Figure 6:
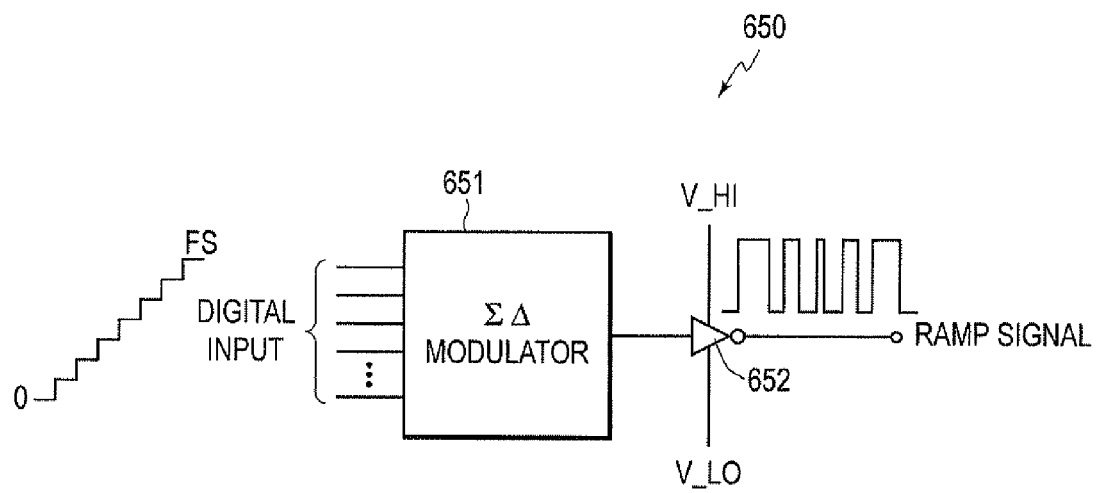
FIG. 6 shows a diagram of another ramp generator example 650 according to an embodiment of the disclosure.

FIG. 6 shows a diagram of another ramp generator example 650 according to an embodiment of the disclosure. The ramp generator 650 includes a sigma-delta modulator 651 and an inverter 652. The sigma-delta modulator 651 receives the digital ramp signal, and generates a modulated pulse stream based on the digital ramp signal. The inverter 652 suitably shapes the HI state and the LO state of the modulated pulse stream. The modulated pulse stream has a relatively high pulse frequency. The pulse stream modulates the capacitance in the ramp state at high frequency, introducing FM modulation in the VCO. Typically, the VCO sensitivity to FM modulation tends to decrease as the FM modulation frequency is increased, so the degradation introduced by the pulse stream can be reduced by increasing the frequency of the pulses.

Figure 7:
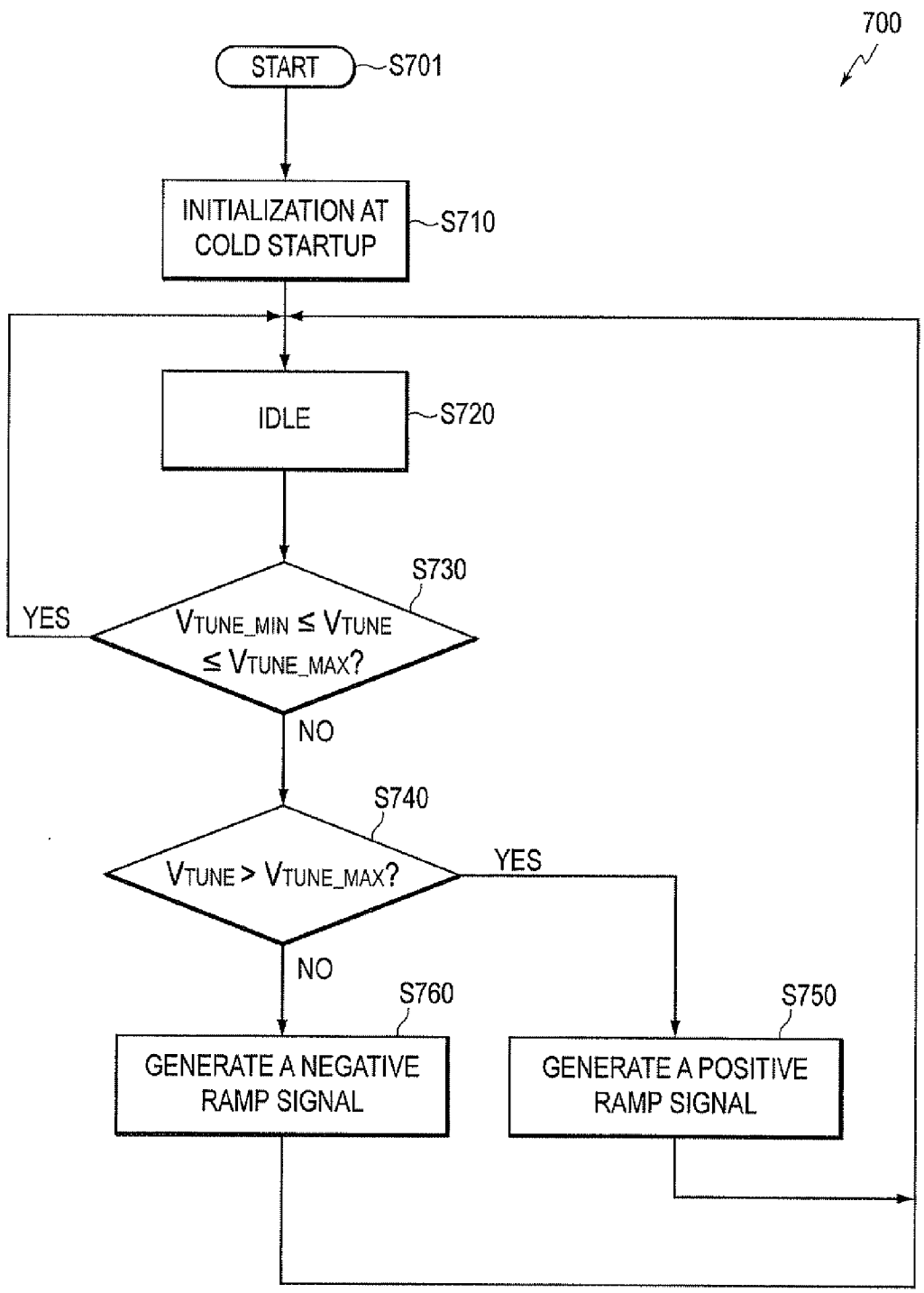
FIG. 7 shows a flow chart outlining a process example 700 according to an embodiment of the disclosure.

FIG. 7 shows a flow chart outlining a process example 700 for a ramp module, such as the ramp module 110, to generate ramp signals according to an embodiment of the disclosure. The ramp module 110 includes the ramp controller 120 and the monitor 115. The process starts at S701, and proceeds to S710.

At S710, the ramp module 110 starts from a cold start up. In an example, the ramp controller 120 is implemented as the ramp controller 420 in FIG. 4. The ramp controller 420 initializes the control signals C-1 to C-N that control half of the voltage control signals $V_{C-1}$ to $V_{C-N}$ to the HI state, and control the other half of the voltage control signals $V_{C-1}$ to $V_{C-N}$ to the LO state.

At S720, the ramp module 110 is idle and keeps signals stable for a time duration.

At S730, the monitor 115 monitors the tuning voltage $V_{TUNE}$, and determines whether the tuning voltage $V_{TUNE}$ stays in the predetermined range. When the tuning voltage $V_{TUNE}$ stays in the predetermined range, the process returns to S720; otherwise, the process proceeds to S740.

At S740, the monitor 115 determines whether the tuning voltage $V_{TUNE}$ is larger than the upper limit. When the tuning voltage $V_{TUNE}$ is larger than the upper limit, the process proceeds to S750; otherwise, the process proceeds to S760.

At S750, the ramp module 110 generates a positive ramp signal. In an example, the positive ramp signal is a ramp-up voltage signal. The ramp-up voltage signal is used to control a component in a VCO, such as a varactor in the second capacitor unit 240 of the VCO 230. The varactor is previously controlled by a LO state control voltage. When the control voltage ramps up, the capacitance of the varactor changes. It is noted that the capacitance change tends to change the oscillating frequency of the VCO 230. When the VCO 230 is used in a PLL, such as the PLL 101, the PLL 101 suitably responds to the capacitance change. When the ramp rate is relatively slow, the PLL 101 gradually reduces the tuning voltage $V_{TUNE}$ to keep the oscillating frequency substantially stable. Then the process returns to S720.

At S760, the ramp module 110 generates a negative ramp signal. In an example, the negative ramp signal is a ramp-down voltage signal. The ramp-down voltage signal is used to control a component in a VCO, such as a varactor in the second capacitor unit 240 of the VCO 230. The varactor is previously controlled by a HI state control voltage. When the control voltage ramps down, the capacitance of the varactor changes. It is noted that the capacitance change tends to change the oscillating frequency of the VCO 230. When the VCO 230 is used in a PLL, such as the PLL 101, the PLL 101 suitably responds to the capacitance change. When the ramp rate is relatively slow, the PLL 101 gradually increases the tuning voltage $V_{TUNE}$ to keep the oscillating frequency substantially stable. Then the process returns to S720.

While the invention has been described in conjunction with the specific embodiments thereof that are proposed as examples, it is evident that many alternatives, modifications, and variations will be apparent to those skilled in the art. Accordingly, embodiments of the invention as set forth herein are intended to be illustrative, not limiting. There are changes that may be made without departing from the scope of the invention.

What is claimed is:

1. An apparatus, comprising:
a voltage-controlled oscillator (VCO) having a first capacitor unit and a second capacitor unit, the VCO being configured to generate an oscillating signal having a frequency based on a first capacitance of the first capacitor unit and a second capacitance of the second capacitor unit;
a detector module configured to generate a voltage signal as a function of the oscillating signal and a reference signal, the voltage signal being used to control the first capacitor unit to stabilize the frequency of the oscillating signal; and
a ramp module configured to generate a ramp signal based on the voltage signal, the ramp signal being used to control the second capacitor unit to ramp the second capacitance from a first value to a second value to keep the voltage signal in a predetermined range, range, the ramp module including:
a monitor configured to monitor the voltage signal, and generate a trigger signal when the voltage signal is out of the predetermined range; and
a counter configured to generate a digital ramp signal by counting in response to the trigger signal.

2. The apparatus of claim 1, wherein
the ramp module is configured to generate the ramp signal when the voltage signal is out of the predetermined range.

3. The apparatus of claim 2, wherein
the ramp module is configured to generate the ramp signal to ramp down the second capacitance when the voltage signal is larger than an upper limit of the predetermined range, and to ramp up the second capacitance when the voltage signal is smaller than a lower limit of the predetermined range.

4. The apparatus of claim 2, wherein the ramp module further comprises:
a ramp controller configured to generate the ramp signal in response to the trigger signal.

5. The apparatus of claim 4, wherein the ramp controller further comprises:
a digital to analog converter (DAC) configured to convert the digital ramp signal to the ramp signal.

6. The apparatus of claim 4, wherein the ramp controller further comprises:
a sigma-delta modulator configured to generate a pulse stream that is modulated based on the digital ramp signal.

7. The apparatus of claim 1, wherein the second capacitor unit includes at least a capacitor, and the ramp signal is used to ramp a control voltage of the capacitor from a first voltage to a second voltage.

8. The apparatus of claim 7, further comprising:
a switch configured to switch the control voltage between a stable state and a ramp state.

9. The apparatus of claim 7, wherein the capacitor is at least one of a junction-diode capacitor, and a metal-oxide-semiconductor (MOS) capacitor.

10. The apparatus of claim 1, wherein the detector module further comprises:
a frequency divider configured to frequency divide the oscillating signal;
a phase detector to detect phase errors between the frequency-divided oscillating signal and the reference signal; and
a loop filter configured to generate the voltage signal based on the phase errors.

11. A method for drift compensation, comprising:
generating an oscillating signal based on a first capacitance of a first capacitor unit and a second capacitance of a second capacitor unit;
generating a voltage signal as a function of the oscillating signal and a reference signal;
adjusting the first capacitance of the first capacitor unit based on the voltage signal to stabilize the frequency of the oscillating signal;
ramping the second capacitance of the second capacitor unit from a first value to a second value when the voltage signal is out of a predetermined range to keep the voltage signal in the predetermined range;
monitoring the voltage signal;
generating a trigger signal when the voltage signal is out of the predetermined range; and
generating a digital ramp signal by counting in response to the trigger signal.

12. The method of claim 11, wherein ramping the second capacitance of the second capacitor unit from the first value to the second value when the voltage signal is out of the predetermined range, further comprises:
ramping down the second capacitance when the voltage signal is larger than an upper limit of the predetermined range; and
ramping up the second capacitance when the voltage signal is smaller than a lower limit of the predetermined range.

13. The method of claim 11, wherein ramping the second capacitance of the second capacitor unit from the first value to the second value when the voltage signal is outside the range, further comprises:
ramping a control voltage of a capacitor in the second capacitor unit from a first voltage to a second voltage, or from the second voltage to the first voltage.

14. The method of claim 13, further comprising:
switching the control voltage of the capacitor from a stable state to a ramp state that ramps from the first voltage to the second voltage or from the second voltage to the first voltage.

15. The method of claim 13, further comprising:
ramping the control voltage of at least one of a junction-diode capacitor, and a metal-oxide-semiconductor (MOS) capacitor.

16. The method of claim 11, further comprising:
generating the ramp signal in response to the trigger signal.

17. The method of claim 16, wherein generating the ramp signal in response to the trigger signal further comprises:
digital to analog converting the digital ramp signal into the ramp signal.

18. The method of claim 16, wherein generating the ramp signal in response to the trigger signal further comprises:
generating a pulse stream that is modulated based on the digital ramp signal.

19. The method of claim 11, wherein generating the voltage signal as a function of the oscillating signal and the reference signal further comprises:
frequency-dividing the oscillating signal;
detecting phase errors between the frequency-divided oscillating signal and the reference signal; and
generating the voltage signal based on the phase errors.

20. An electronic system, comprising:
a phase-locked loop (PLL) for generating an oscillating signal, the PLL comprising:
a voltage-controlled oscillator (VCO) having a first capacitor unit and a second capacitor unit, the VCO being configured to generate the oscillating signal having a frequency based on a first capacitance of the first capacitor unit and a second capacitance of the second capacitor unit;
a detector module configured to generate a voltage signal as a function of the oscillating signal and a reference signal, the voltage signal being used to control the first capacitor unit to stabilize the frequency of the oscillating signal; and
a ramp module configured to generate a ramp signal based on the voltage signal, the ramp signal being used to control the second capacitor unit to ramp the second capacitance from a first value to a second value to keep the voltage signal in a predetermined range, the ramp module including:
a monitor configured to monitor the voltage signal, and to generate a trigger signal when the voltage signal is out of the predetermined range; and
a counter configured to generate a digital ramp signal by counting in response to the trigger signal,
a transceiver configured to operate based on the oscillating signal.

* * * * *